April 18, 1961 B. V. LAWSON 2,980,829

CRYSTAL-SUPPORT ASSEMBLY AND METHOD OF FORMING SAME

Filed Feb. 6, 1959

INVENTOR.
BASIL V. LAWSON
BY
Fordyce A. Bothwell
ATTORNEY

United States Patent Office 2,980,829
Patented Apr. 18, 1961

2,980,829

CRYSTAL-SUPPORT ASSEMBLY AND METHOD OF FORMING SAME

Basil V. Lawson, Elkins Park, Pa., assignor to Philco Corporation, Philadelphia, Pa., a corporation of Pennsylvania Filed Feb. 6, 1959, Ser. No. 791,714

7 Claims. (Cl. 317—234)

This invention relates to the jointure of semiconductor crystals to supporting elements, e.g. supporting studs, in semiconductor devices which are to be operated at temperatures such as to practically preclude jointure of the crystal and its supporting element by any method utilizing heat that would adversely affect the crystal. More particularly, the invention relates to the provision in such devices of a joint, between the semiconductor crystal and its supporting stud, which has low ohmic resistance and is mechanically strong.

In the manufacture of certain semiconductor devices such as point contact diodes, for example, it is necessary to bond a semiconductor crystal to an electrically-conductive supporting element so as to form a low resistance ohmic joint and a strong mechanical bond between the crystal and the supporting element. In the past crystals have been bonded to supporting studs by soldering. For example, where the crystal was to be bonded to a brass stud, both the crystal and the stud might be plated with nickel and then soldered together. However, this soldering method is suitable only for semiconductor devices which are to be operated at temperatures below the melting point of the solder employed. As to semiconductor devices which are to be operated at substantially higher temperatures, e.g. above 350° C., solders which melt at or below the operating temperature cannot be used; and if a solder is employed having a melting point substantially higher than the operating temperature, the temperature required for the soldering operation tends adversely to affect the semiconductive material.

With increasing use of semiconductor devices, many usages involve high operating temperatures. Gallium arsenide crystals, for example, are particularly well suited for high temperature operation, e.g. above 350° C., but at substantially higher temperature required for soldering such crystals tend to decompose. Accordingly these has been an increasingly urgent need for a satisfactory method of attaching such crystals to supporting studs so as to form a joint therebetween which has low ohmic resistance and is mechanically strong.

One object of the present invention is to provide a satisfactory method for the crystal-to-stud jointure in devices which are to be operated at temperatures such as to preclude the use of heat that would adversely affect the crystal.

Another object of the invention is to provide a crystal-stud assembly for use at such temperatures wherein the joint has low ohmic resistance and is mechanically strong.

The method provided by this invention includes essentially the following two steps—(1) alloying into the crystal a metal suitable for achievement of the desired low resistance ohmic jointure of the crystal and stud, and (2) joining the metal-alloyed crystal to the stud by means of an electroformed metallic bond, i.e. by electroplating suitable metal onto juxtaposed portions of the crystal and stud. Preferably the latter step is carried out by bringing one end of the stud and the crysal into juxtaposed relation, with an end face of the stud and one of the faces of the crystal in confronting relation to one another, and then electroforming metal onto and about the adjacent portions of the stud and crystal. Since the electroformed metal is capable of withstanding even the highest operating temperatures, the crystal-stud assembly is adapted for operation at such temperatures.

I have found that the combination of metal alloying the crystal and electroforming a bonding metal onto the crystal and stud provides a mechanically-strong low resistance ohmic joint which is admirably suited for high temperature operation. Experimentation has shown, not only that the electroforming of a metal bond provides a strong joint, but that this in cooperation with suitable metal alloying of the crystal gives an extremely low resistance ohmic joint.

The invention may be fully understood from the following detailed description with reference to the accompanying drawing wherein Fig. 1 is a part elevational and part sectional large-scale view of a joined metal-alloyed crystal and supporting stud according to this invention;

By way of example, the present invention, as applied to gallium arsenide crystals, may involve alloying of indium into each crystal and electroforming a nickel bond onto and about the juxtaposed crystal and stud. The invention will now be described as thus applied, but it will be understood that the invention is applicable to any crystal-stud assembly which is to be operated at a temperature such as to preclude the use of heat that would adversely affect the crystal. Moreover, the invention contemplates the use of any suitable metals for the alloying of the crystal and the electroforming of the bond.

In the example here to be described, the first step is to alloy indium into each gallium arsenide crystal which is to be joined to a mounting stud. A suitable procedure is to bath plate crystal wafers with indium and alloy the indium into the wafers by heating the plated wafers at 250° C. for one hour, or at 400° C. for twenty minutes, in a forming gas atmosphere which may consist of a mixture of 90% nitrogen and 10% hydrogen. Of course, the temperature employed should be such as to avoid adverse effect upon the gallium arsenide. This procedure for alloying of a metal such as indium into a semiconductor crystal is well known and requires no further description. Any excess of indium may be removed by etching with dilute hydrochloric acid. The wafers are then cut into blanks or crystals of desired size.

Figure 1:
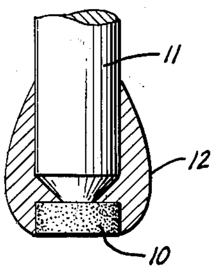

Each crystal is then bonded to its supporting stud by placing the crystal and the stud in juxtaposed relation with one another and then electroforming a nickel bond in surrounding relation to the crystal and a portion of the stud. Thus as shown in Fig. 1, the metal-alloyed crystal 10 and its supporting stud 11 are bonded together by a surrounding electroformed nickel coating 12.

Figure 2:
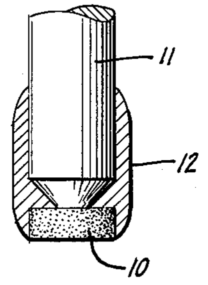
Fig. 2 is a similar view of the same structure after grinding treatment.
Figure 3:
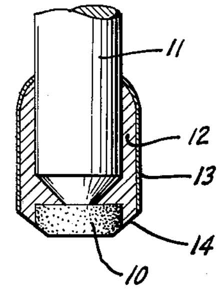
Fig. 3 is a similar view of the same structure after plating of the same to provide a skin on the outer surface having low resistance at microwave frequencies.

After the bonding is completed by the electroforming operation, the excess nickel plate is removed by grinding so that the bond takes the form shown in Fig. 2. A flash coating of silver is then applied to the nickel surface, as shown at 13 in Fig. 3, in order to provide a skin having low resistance at microwave frequencies. Then the edge is chamfered as shown at 14 in Fig. 3.

Any nickel on the outer face of the crystal is removed by means of abrasive such as American Optical Abrasive No. 305, and the exposed crystal face is then polished, for example on an optical polishing wheel using a suitable polishing compound such as "Gamal" ($\gamma$ alumina) compound manufactured and sold by Fisher Scientific Company.

Figure 4:
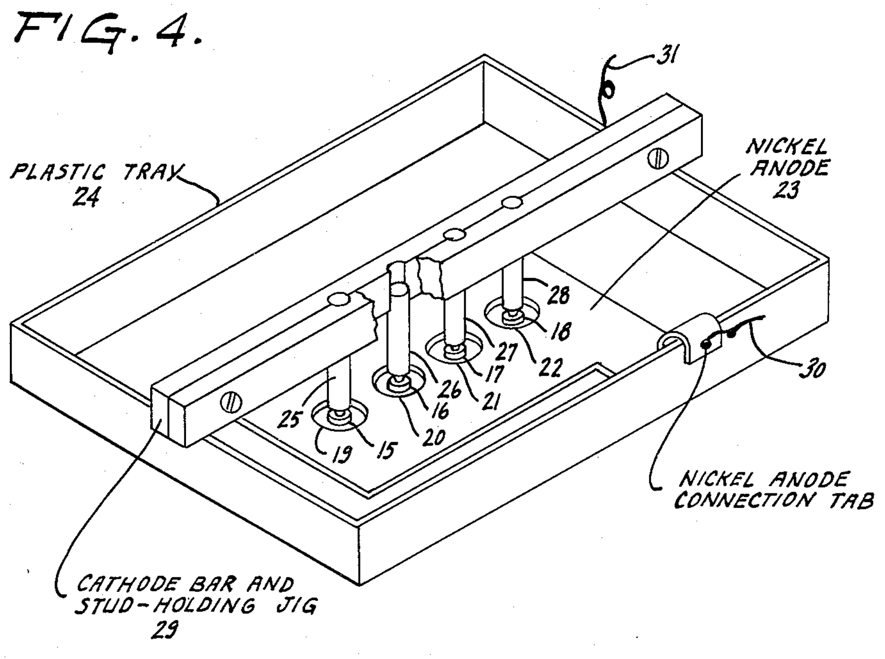
Fig. 4 is an isometric view of apparatus preferably employed in the electroforming operation.

The above-described electroforming of the bond between the crystal and stud is preferably performed in a batch operation as shown in Fig. 4. A number of metal-alloyed crystals, e.g., the four crystals 15 to 18, are centered in holes 19 to 22 in a nickel anode 23 placed on the bottom of a shallow plastic tray 24. The studs 25 to 28, which may be nickel-plated brass studs, are supported by a cathode bar and stud-holding jig 29. This assembly is such that when it is properly placed across the tray the studs are aligned with and engage the crystals. Commercial nickelous fluoborate solution is placed in the tray to a sufficient depth for the length of bond desired, and plating current is applied through leads 30 and 31 attached to the anode and cathode. The plating current may be approximately one miliampere per stud and may be maintained for about six hours.

With respect to the extremely low resistance ohmic joint obtained by this invention, it is not definitely known why the combination of metal alloying the crystal and electro-forming the bond provides such joint, but it is postulated that in the example described this is due to the formation of indium arsenide at the surfaces of the crystal which forms cooperatively with the bonding nickel an extremely low resistance joint between the crystal and the stud.

In some instances it may be found expedient to metal plate the metal-alloyed crystal prior to the electroforming operation. Thus in the described example the indium-alloyed crystal could be electrolessly plated, i.e. bath plated, with nickel prior to the electroforming operation This serves further to enhance the low resistance ohmic joint, and while generally it is unnecessary, it may be employed in any instance where it may be desired to reduce the resistance of the joint even lower than that achieved by the combination of metal alloying the crystal and electroforming the bond. Since electroless plating of crystals is well known, detailed description thereof is unnecessary.

While this invention is particularly useful as applied to gallium arsenide crystals adapted for high temperature operation, it will be understood that the invention is not limited thereto but is applicable to the formation of the crystal-to-stud joint in any instance where the intended operating temperature is such as to preclude the use of heat that would adversely affect the crystal. Of course, in any instance the metal employed in the alloying of the crystal should be one which is conducive to the formation of the desired low resistance ohmic joint, and the metal employed in the electroforming operation to bond the crystal and the stud should be one which serves cooperatively with the first-mentioned metal to form a low resistance ohmic joint between the crystal and the stud.

It will be understood, therefore, that invention is intended to be applicable wherever it may serve its intended purpose, and that it contemplates such embodiments as may occur to those skilled in the art.

I claim:

1. A method of forming a low resistance ohmic joint and a strong mechanical bond between a semiconductor crystal and its supporting stud for operation at temperatures such as to preclude the use of heat that would adversely affect the crystal, which method includes the steps of alloying into the crystal a metal conducive to the formation of such joint, assembling the metal-alloyed crystal and the supporting stud in juxtaposed relation to one another with one end of the stud in confronting relation to a face of the crystal, and electroplating onto and in surrounding embracing relation to the adjacent portions of both the metal-alloyed crystal and the supporting stud a metal which strongly bonds them together and which serves cooperatively with the first-mentioned metal to form a low resistance ohmic joint between the crystal and the supporting stud.

2. A method according to claim 1, including the additional intermediate step of metal plating the metal-alloyed crystal prior to the assemblage of the crystal and the stud for the electroplating operation.

3. A method of forming a low resistance ohmic joint and a strong mechanical bond between a gallium arsenide crystal and its supporting stud for operation at high temperatures, which method includes the steps of alloying indium into the gallium arsenide crystal, assembling the indium-alloyed crystal and the supporting stud in juxtaposed relation to one another with one end of the stud in confronting relation to a face of the crystal, and electroplating nickel onto the adjacent portions of the indium-alloyed crystal and the supporting stud to bond them together and to form cooperatively with the indium a low resistance ohmic joint between the crystal and the supporting stud.

4. A method according to claim 3, wherein the last-recited step involves electroplating the nickel bond in surrounding relation to the adjacent portions of the crystal and the stud.

5. A method according to claim 4, including the additional intermediate step of nickel plating the indium-alloyed crystal prior to the assemblage of the crystal and the stud for the electroplating operation.

6. A semiconductor crystal and supporting stud assembly having a low resistance ohmic joint and a strong mechanical bond between the crystal and the supporting stud for operation at high temperatures, said assembly comprising a crystal having metal alloyed therein, a supporting stud having one end in juxtaposed confronting relation to a face of the metal-alloyed crystal, and an electroplated metal bond extending over the adjacent portions of both the metal-alloyed crystal and the stud in surrounding embracing relation to said portion so as to strongly bond the two together and to form cooperatively with the first-mentioned metal a low resistance ohmic joint between the crystal and supporting stud.

7. A semiconductor crystal and supporting stud assembly for operation at high temperatures, comprising a gallium arsenide crystal having indium alloyed therein, a supporting stud having one end in juxtaposed confronting relation to a face of the indium-alloyed crystal, and an electroplated nickel bond extending over the adjacent portions of the indium-alloyed crystal and the stud in surrounding relation thereto so as to form cooperatively with the indium a low resistance ohmic joint between the crystal and the supporting stud.

References Cited in the file of this patent

UNITED STATES PATENTS

| | | |
|---|---|---|
| 2,192,255 | Bickley | Mar. 5, 1940 |
| 2,868,988 | Miller | Jan. 13, 1959 |